United States Patent
Ovshinsky (10) Patent No.: US 7,227,170 B2
(45) Date of Patent: *Jun. 5, 2007

(54) MULTIPLE BIT CHALCOGENIDE STORAGE DEVICE

(75) Inventor: Stanford R. Ovshinsky, Bloomfield Hills, MI (US)

(73) Assignee: Energy Conversion Devices, Inc., Rochester Hills, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/657,285

(22) Filed: Sep. 8, 2003

(65) Prior Publication Data

US 2004/0178404 A1    Sep. 16, 2004

Related U.S. Application Data

(63) Continuation-in-part of application No. 10/426,321, filed on Apr. 30, 2003, now Pat. No. 6,967,344, and a continuation-in-part of application No. 10/384,994, filed on Mar. 10, 2003, now Pat. No. 6,969,867.

(51) Int. Cl.
  *H01L 47/00*    (2006.01)
  *G11C 11/00*    (2006.01)
(52) U.S. Cl. .................. 257/2; 257/3; 257/4; 257/5; 365/163
(58) Field of Classification Search ............ 257/2–4, 257/200, 296, 314, 5; 365/148, 46, 163, 365/200
See application file for complete search history.

(56) References Cited

U.S. PATENT DOCUMENTS 3,336,486 A    8/1967 Ovshinsky
3,748,501 A    7/1973 Fritzsche 5,166,758 A    11/1992 Ovshinsky (Continued)

FOREIGN PATENT DOCUMENTS

GB    2296820 A  *  7/1996

*Primary Examiner*—Shouxiang Hu
(74) *Attorney, Agent, or Firm*—Kevin L. Bray (57) ABSTRACT

Multi-terminal chalcogenide memory cells having multiple binary or non-binary bit storage capacity and methods of programming same. The memory cells include a pore region containing a chalcogenide material along with three or more electrical terminals in electrical communication therewith. The configuration of terminals delineates spatially distinct regions of chalcogenide material that may be selectively and independently programmed to provide multibit storage. The application of an electrical signal (e.g. electrical current or voltage pulse) between a pair of terminals effects a structural transformation in one of the spatially distinct portions of chalcogenide material. Application of electrical signals to different pairs of terminals within a chalcogenide device effects structural transformations in different portions of the chalcogenide material. The structural states produced by the structural transformations may be used for storage of information values in a binary or non-binary (e.g. multilevel) system. The selection of terminals provides for the selective programming of specific and distinct portions within a continuous volume of chalcogenide material, where each selectively programmed portion provides for the storage of a single binary or non-binary bit. In devices having three or more terminals, two or more selectively programmable portions are present within the volume of chalcogenide material occupying the pore region and multibit storage is accordingly realized. The instant invention further includes methods of programming chalcogenide memory cells having three or more terminals directed at the storage of multiple bits of information in binary or non-binary systems.

15 Claims, 4 Drawing Sheets

U.S. PATENT DOCUMENTS

| | | |
|---|---|---|
| 5,296,716 A | 3/1994 | Ovshinsky |
| 5,414,271 A | 5/1995 | Ovshinsky |
| 5,536,947 A | 7/1996 | Klersy |
| 5,543,737 A | 8/1996 | Ovshinsky |
| 5,596,522 A | 1/1997 | Ovshinsky |
| 5,694,146 A | 12/1997 | Ovshinsky |
| 5,757,446 A | 5/1998 | Ovshinsky |
| 5,912,839 A | 6/1999 | Ovshinsky |
| 6,087,674 A | 7/2000 | Ovshinsky |
| RE37,259 E | 7/2001 | Ovshinsky |
| 6,774,387 B2 * | 8/2004 | Maimon .................. 257/2 |
| 6,895,148 B2 * | 5/2005 | Gunn, III ................. 385/50 |
| 6,967,344 B2 * | 11/2005 | Ovshinsky et al. ........... 257/2 |
| 2002/0036931 A1 * | 3/2002 | Lowrey et al. ............ 365/200 |

* cited by examiner

FIG. 1

(Prior Art)

FIG. 2

(Prior Art)

MULTIPLE BIT CHALCOGENIDE STORAGE DEVICE

CROSS-REFERENCE TO RELATED APPLICATIONS

This application is a continuation-in-part of application Ser. No. 10/384,994, filed Mar. 10, 2003 now U.S. Pat. No. 6,969,867, the disclosure of which is herein incorporated by reference and a continuation-in-part of application Ser. No. 10/426,321, filed Apr. 30, 2003 now U.S. Pat. No. 6,967,344, the disclosure of which is herein incorporated by reference.

FIELD OF INVENTION

This invention relates to chalcogenide storage devices. More particularly, this invention relates to devices having multiple terminals in electrical communication with a chalcogenide material in which different pairs of terminals are capable of programming different portions of the chalcogenide material. Most particularly, this invention relates to chalcogenide devices that provide a multiple bit data storage capability.

BACKGROUND OF THE INVENTION

Computers and consumer electronics are critically dependent on the memories used to store and process information. Various types of memories, including ROM, RAM, DRAM, SRAM and flash, underlie the storage and processing capabilities of computers and consumer electronics. These different forms of memory differ with respect to speed and volatility and are optimized with respect to specific tasks to provide for efficient operation. ROM, Read Only Memory, is memory that stores programs used by computers on booting (BIOS program) and for diagnostics. Data is pre-recorded on ROM and once recorded, data cannot be removed from ROM, but rather can only be read. ROM is constructed from logic hard-wired in silicon. For this reason, ROM is a highly permanent form of memory that offers a high degree of security and is not susceptible to attacks by viruses. ROM is a non-volatile form of memory, which means that ROM retains its contents when the power is turned off. Most computers have only a few kilobytes of ROM. ROM is also widely used in calculators and in peripheral devices such as laser printers. Variations of ROM include PROM (Programmable ROM), EPROM (Erasable PROM) and EEPROM (Electrically Erasable PROM). PROM is a form of ROM that is produced in an unrecorded state and is once writable and not erasable. PROM offers purchasers the ability to record programs on a ROM medium and the flexibility of changing the program as the requirements of a particular application change. EPROM a form of ROM that is erasable under action of ultraviolet light and that can be reprogrammed. EEPROM is an electrically erasable form of ROM that can be erased through software.

RAM, Random Access Memory, is the most common type of memory found in computers and other devices. RAM is the working memory of computers and is the memory utilized by programs. Data can be written, erased and re-recorded on RAM. RAM is a volatile form of memory, which means that its contents are erased when the power is turned off. DRAM (dynamic RAM) and SRAM (static RAM) are the two most common variations of RAM. DRAM is less expensive, but slower than SRAM and is characterized by a need for constant refreshing in order to retain data. The refresh requirement of DRAM is a consequence of the mechanism of data storage in a DRAM memory cell. A DRAM memory cell includes a capacitor and data is stored as charge on the capacitor. The capacitor charge is not stored permanently, however, and shows a tendency to leak to the substrate on which the DRAM cell is located or to neighboring devices on a chip. Since leakage of charge corresponds to loss of data, the charge is periodically refreshed. The refreshing requirement drives up power consumption and underlies the volatile characteristic of DRAM. Access times for DRAM are typically on the order of 60 nsec.

SRAM is a form of RAM that retains its information content without the need to refresh as long as power is maintained. SRAM is faster than DRAM, but also more expensive because an SRAM memory cell requires more transistors than DRAM (typically 4-6 transistors as opposed to one for DRAM) and requires more space on a chip. Access times for SRAM are on the order of 10 nsec and SRAM also has a much shorter cycle time (time between successive memory accesses) than DRAM because DRAM requires a pause between successive accesses due to refreshing limitations. From a performance basis, SRAM is superior to DRAM. But given its higher cost, however, it is primarily used in cache memory applications, where high speed is essential.

Flash memory is the leading non-volatile memory used in consumer electronics. Flash is a compact form of memory that is portable and conveniently interfaced with many devices. Flash is an erasable and rewritable form of memory. Flash is the memory of choice for many modern devices including cellphones (where flash is used to store the instructions needed to send and receive calls as well as to retain phone numbers), personal digital assistants (where flash is used to store addresses, calendar entries, memos etc.) and digital cameras (where flash is the type of memory used in the erasable media cards that store pictures).

Flash memory is a type of EEPROM that relies on a floating gate to store charge. The flash memory cell is similar in construction to a transistor and includes a floating gate (typically a polysilicon layer) and a tunnel oxide layer that are inserted between the oxide of the control gate and the channel region of a transistor. Data in the form of a "0" or "1" is stored by controlling the charge of the floating gate. If no charge is stored on the floating gate, current flows from source to drain when a voltage is applied to the control gate as the transistor turns on. If a charge is stored, current is inhibited and application of a gate voltage fails to turn on the transistor. The information content in a flash memory cell is thus determined through a simple read protocol involving a determination of whether an applied gate voltage turns the transistor on.

As the demands for faster, less expensive, smaller and more efficient computers and consumer electronics become more stringent, chip manufacturers and device designers have come to recognize the deficiencies of current memory technologies and have begun to search for alternative materials and devices for storing data. There is currently a great deal of interest in identifying replacements for flash memory because of the importance of flash memory for many applications and because of several shortcomings that have been identified with flash memory. Current flash memory suffers from two important drawbacks. First, the write time of flash memory is slow (on the order of a microsecond) and limits the range of applications for flash memory. While suitable for archival storage, flash is unsuitable for use as a working memory because competitive data processing requires fast writing times. Second, the lifetime of flash memory is relatively short as the reliability of data storage in flash memory diminishes after a few hundred thousand write-erase cycles.

Three new technologies directed at obtaining a faster, more reliable replacement for flash memory are currently under development. In one technology, FRAM (Ferroelectric RAM), a ferroelectric material is used to store data. An FRAM memory cell includes a capacitor containing a ferroelectric material such as PZT that records binary information based on the orientation of the ferroelectric domains of the ferroelectric material. The ferroelectric domains can be reversibly aligned in one of two directions to define two binary states that can be distinguished in a read operation based on determining a current upon application of a short voltage pulse to the capacitor. Depending on the orientation of the ferroelectric domains relative to the electric field associated with the voltage pulse, the current induced by the voltage pulse is either high or low. A second technology, MRAM (Magnetoresistive RAM), utilizes the ferromagnetic properties of atoms. MRAM is a magnetic analogue of FRAM that relies on the ferromagnetic characteristics of a ferromagnetic material to store information. A ferromagnetic material includes domains having a magnetic dipole, where the domains can be aligned and oriented under the action of an external magnetic field. As in FRAM, the orientation of aligned magnetic domains defines two binary states that are used to record information. In one device configuration, MRAM includes a magnetic tunnel junction that includes two ferromagnetic layers separated by a tunnel oxide where the relative orientation of the magnetic domains of the two ferromagnetic layers dictates that current flow across the junction. The current flow is high when the two ferromagnetic layers have parallel magnetic domains and is low when the two ferromagnetic layers have anti-parallel domains. A third technology with the potential to replace flash memory is Ovonic Unified Memory (OUM). OUM records information through the phase of a chalcogenide phase change material. Chalcogenide phase change materials can be reversibly transformed between amorphous and crystalline states where each state may correspond to a different binary state. Since the amorphous and crystalline states differ in resistance by two or more orders of magnitude, the two states are readily distinguishable.

FRAM, MRAM and OUM all address the deficiencies of conventional flash memory. All three potential flash replacement technologies offer fast writing times and essentially endless cycle life stability. All three technologies also are non-volatile and require no static power. Development work in the three flash replacement technologies is focusing on cost, deposition and manufacturing issues. Of greatest concern is the ability to integrate the technologies into existing CMOS fabrication processes. Also of concern is the development of adequate, reliable and reproducible growth methods for forming uniform thin film layers of ferroelectric, ferromagnetic or chalcogenide materials and the compatibility of these layers with conventional silicon based materials.

An additional consideration concerns the data storage capacity of potential flash replacement technologies. Current efforts in the development of FRAM, MRAM and OUM have focused on memory cells capable of storing one bit of information per memory cell or volume of active ferroelectric, ferromagnetic or chalcogenide material. Under this assumption, it is believed that development of the three replacement flash technologies will ultimately lead to data storage capacities that are comparable to those of conventional flash. In this view, it is believed that the advantageous writing speed and reliability features of FRAM, MRAM or OUM will ultimately prevail and convince industry to drop flash and adopt a superior replacement technology. Recent advances in conventional flash memory, however, have raised the entry barrier for a replacement flash technology. These advances have led to the development of flash memory that can store two or more bits of information per data cell. As a result, the cost per stored bit of information has dropped considerably in current flash technology and the performance and cost standards for a competing replacement technology have increased commensurately.

At this point in time, it is unknown whether any of the three currently identified replacement flash technologies will prove to be better than the others and whether any of them will perform well enough to displace conventional flash technology. It is clear, however, that any replacement for flash must provide a competitive storage capacity. A need exists, therefore, for a non-volatile memory technology capable of providing a data storage capacity comparable to the two or more bit per cell storage offered by today's flash technology.

SUMMARY OF THE INVENTION

The instant invention provides a chalcogenide device capable of providing two or more bits of storage in a volume of chalcogenide material contained in the pore region of the device. The chalcogenide material has a plurality of structural states and data storage is accomplished by associating different structural states of the chalcogenide material with different information values in a binary or non-binary system. Programming or the storage of data occurs by applying energy to a chalcogenide material through electrical terminals in an amount sufficient to induce a transformation of the chalcogenide material to the structural state associated with the desired stored information value.

The instant chalcogenide device includes a volume of chalcogenide material with three or more electrical terminals in electrical communication therewith. The positioning of the electrical terminals has the effect of dividing the volume of chalcogenide material into distinct portions, each of which, in one embodiment, may be independently programmed to store a bit of information. Each of two or more separate portions of chalcogenide material may be programmed by one or more pairs of electrical terminals and may be independently programmed by at least one pair of electrical terminals. The separately programmable portions of chalcogenide material are portions within a larger continuous volume of a chalcogenide material occupying the pore region of the device. The different separately programmable portions may comprise the same chalcogenide material composition or may include different chalcogenide material compositions.

In one embodiment of the instant invention, selective programming of individual portions of chalcogenide material within a larger volume of chalcogenide material having one or more compositions is provided. In this embodiment, a programming pulse applied between a pair of electrical terminals of a device induces a structural transformation in a portion of chalcogenide material between that pair of electrical terminals without inducing a structural transformation of chalcogenide material in the vicinity of other terminals. In this embodiment, data storage in one portion of a chalcogenide material occurs without disturbing the information content of an adjacent portion of chalcogenide material.

In another embodiment of the instant invention, the energy content of a programming pulse is in excess of the energy required to transform the structural state of the chalcogenide material between the two terminals to which the programming pulse is applied. In this embodiment, the excess energy may diffuse or otherwise dissipate to one or more adjacent portions of chalcogenide material and may induce a structural transformation in those portions to effect a modification in the information value stored in those portions.

Multiple bit data storage in the instant memory cell is achieved by applying electrical signals selectively to electrical terminals that influence separate portions of the chalcogenide material. One bit of data may be stored in each selectively programmable portion of chalcogenide material by applying an electrical signal through or across a pair of electrical terminals in electrical communication with that portion of chalcogenide material. Application of an electrical signal to selected electrical terminals transforms a selected portion of chalcogenide material to a structural state corresponding to an information value intended to be stored. Selective application of electrical signals to different pairs of electrical terminals enables multibit storage in two or more portions of chalcogenide material in the instant device. Multiple binary or non-binary bit storage is possible with the instant device. In a binary embodiment, each of two or more portions of a chalcogenide material stores a binary bit of information and is programmed to one of two structural states. In a non-binary embodiment, each compartment stores a multary (non-binary) bit of information and is programmed to one of a plurality of structural states. The instant invention further comprises an array of multibit chalcogenide data storage cells.

The instant invention further provides a method of programming a chalcogenide device to achieve a storage capacity of two or more bits in a volume of chalcogenide material in the pore region of a device. The programming methods include providing sufficient energy in the form of an electrical pulse applied between a pair of electrical terminals to induce a transformation in the structural state of a chalcogenide and repeating for each pair of terminals in a multi-terminal device to achieve information storage or programming of two or more distinguishable portions of chalcogenide material in a continuous volume of chalcogenide material within the pore of a device.

For a better understanding of the instant invention, together with other and further objects thereof, reference is made to the following description, taken in conjunction with the accompanying drawings and claims.

DETAILED DESCRIPTION OF EMBODIMENTS

The instant invention provides a memory cell capable of multibit data storage and a method for programming a memory cell to store two or more bits of information. The memory cell of the instant invention includes a volume of chalcogenide material in electrical communication with three or more electrical terminals where electrical energy provided to the electrical terminals is used to program the chalcogenide material to store data. The chalcogenide material is the data storage medium of the instant memory cell. The chalcogenide material is a phase change material that is capable of reversibly transforming among a plurality of structural states by providing electrical energy in the form of an electrical current or voltage pulse. The different structural states of the phase change material are distinguishable on the basis of a characteristic property such as electrical resistance and each can be uniquely associated with different information states to provide the basis of a data storage protocol.

The chalcogenide materials of the instant memory cells have been previously utilized in optical and electrical memory and switching applications and some representative compositions and properties have been discussed in in U.S. Pat. Nos. 5,543,737; 5,694,146; 5,757,446; 5,166,758; 5,296,716; 5,534,711; 5,536,947; 5,596,522; and 6,087,674; the disclosures of which are incorporated by reference herein, as well as in several journal articles including "Reversible Electrical Switching Phenomena in Disordered Structures", Physical Review Letters, vol. 21, p.1450-1453 (1969) by S. R. Ovshinsky; "Amorphous Semiconductors for Switching, Memory, and Imaging Applications", IEEE Transactions on Electron Devices, vol. ED-20, p. 91-105 (1973) by S. R. Ovshinsky and H. Fritzsche; the disclosures of which are incorporated by reference herein. General characteristics and comments about phase change chalcogenide materials are reviewed in the context of the instant invention in the following discussion.

Representative chalcogenide materials suitable for use in the instant invention are those that include one or more elements from column VI of the periodic table (the chalcogen elements) and optionally one or more chemical modifiers from columns III. IV or V. One or more of S, Se, and Te are the most common chalcogen elements included in the chalcogenide data storage material of the instant memory devices. Materials that include Ge, Sb, and/or Te, such as $Ge_2Sb_2Te_5$, are examples of chalcogenide materials in accordance with the instant invention. The chalcogen elements are characterized by divalent bonding and the presence of lone pair electrons. The divalent bonding leads to the formation of chain and ring structures upon combining chalcogen elements to form chalcogenide materials and the lone pair electrons provide a source of electrons for forming a conducting filament in switching applications. The conducting filament may also contribute to or aid in driving phase changes that occur between different structural states. Trivalent and tetravalent modifiers such as Al, Ga, In, Ge, Sn, Si, P, As and Sb enter the chain and ring structures of chalcogen elements and provide points for branching and crosslinking. The structural rigidity of chalcogenide materials depends on the extent of crosslinking and influences their ability to undergo crystallization or other structural transformations or rearrangements.

An important feature of the chalcogenide materials in the context of the instant invention is their ability to undergo a reversible phase transformation between or among two or more structural states. The chalcogenide materials have structural states that include a crystalline state, one or more partially crystalline states and an amorphous state. The crystalline state may be a single crystalline state or a polycrystalline state. As used herein, a partially crystalline state refers to a structural state of a volume of chalcogenide material that includes an amorphous portion and a crystalline portion. Preferably, a plurality of partially crystalline states exists for the phase change material that may be distinguished on the basis of the relative proportion of the amorphous and crystalline portions. Fractional crystallinity is one way to characterize the structural states of a chalcogenide phase change material. The fractional crystallinity of the crystalline state is 100%, the fractional crystallinity of the amorphous state is 0%, and the partially crystalline states have fractional crystallinities that vary continuously between 0% (the amorphous limit) and 100% (the crystalline limit). Phase change chalcogenide materials are thus able to reversibly transform among a plurality of structural states that vary inclusively between fractional crystallinities of 0% and 100%.

The ability and facility of a chalcogenide material to undergo structural transformations among structural states having various fractional crystallinities depends on the composition and structural characteristics of the chalcogenide material. More highly crosslinked chalcogenide materials are more structurally rigid and generally include a higher concentration of modifiers. The more highly crosslinked chalcogenide materials are more difficult to crystallize because the atomic rearrangements required to nucleate and grow a crystalline phase are inhibited due to the rigidity of the structure. More lightly crosslinked chalcogenide materials more readily undergo full or partial crystallization.

Transformations among the structural states of a chalcogenide material are induced by providing energy to the chalcogenide material. Energy in various forms can influence the fractional crystallinity of a chalcogenide material and hence, induce structural transformations. Suitable forms of energy include electrical energy, thermal energy, optical energy or other forms of energy that induce electrical, thermal or optical effects in a chalcogenide material (e.g. particle beam energy) or combinations of the foregoing forms of energy. Continuous and reversible variability of the fractional crystallinity is achievable by controlling the energy environment of a chalcogenide material. A crystalline state can be transformed to a partially crystalline or an amorphous state, a partially crystalline state can be transformed to a crystalline or amorphous state, and an amorphous state can be transformed to a partially crystalline or crystalline state through proper control of the energy environment of a chalcogenide material. Some considerations associated with the use of thermal, electrical and optical energy to induce structural transformations are presented in the following discussion.

The use of thermal energy to induce structural transformations exploits the thermodynamics and kinetics associated with the crystalline to amorphous or amorphous to crystalline phase transitions. An amorphous phase may be formed, for example, from a partially crystalline or crystalline state by heating a chalcogenide material above its melting temperature and cooling at a rate sufficient to inhibit the formation of crystalline phases. A crystalline phase may be formed from an amorphous or partially crystalline state, for example, by heating a chalcogenide material above the crystallization temperature for a sufficient period of time to effect nucleation and/or growth of crystalline domains. The crystallization temperature is below the melting temperature and corresponds to the minimum temperature at which crystallization may occur. The driving force for crystallization is typically thermodynamic in that the free energy of a crystalline or partially crystalline state is lower than the free energy of an amorphous state so that the overall energy of a chalcogenide material decreases as the fractional crystallinity increases. Formation (nucleation and growth) of a crystalline state or crystalline domains within a partially crystalline state is kinetically inhibited, however, so that heating below the melting point promotes crystallization by providing energy that facilitates the rearrangements of atoms needed to form a crystalline phase or domain. The fractional crystallinity of a partially crystalline state can be controlled by controlling the temperature or time of heating of crystalline or partially crystalline state or by controlling the temperature or rate of cooling of an amorphous or partially crystalline state.

The use of optical energy to induce structural transformation involves providing energy in the form of an optical pulse to a chalcogenide material. The optical pulse may be from a laser or a conventional lamp or incandescent source. The optical pulse contains optical energy that is transferred to a chalcogenide material when an optical beam is directed at or otherwise incident to a chalcogenide material. Optical energy can induce transformations among the crystalline, partially crystalline and amorphous states of a chalcogenide material. Use of chalcogenide materials in CD and DVD applications, for example, is well known and relies on the use of an optical source to induce transformations between the crystalline and amorphous states of a chalcogenide material. Frequently an unrecorded state corresponds to the crystalline state and writing or storage of data occurs through the selective formation of amorphous marks where the pattern of marks corresponds to stored information. Transfer of optical energy to a chalcogenide material may occur through optical absorption and may be accompanied by a thermal effect associated with the dissipation of optical energy within a chalcogenide material. Optical energy may be used to melt or crystallize a chalcogenide material. By controlling the wavelength, intensity, duration, and profile of optical pulses, it is possible to manage the energy environment of a chalcogenide material and to reversible transform a chalcogenide material among its crystalline, partially crystalline and amorphous states.

Figure 1:
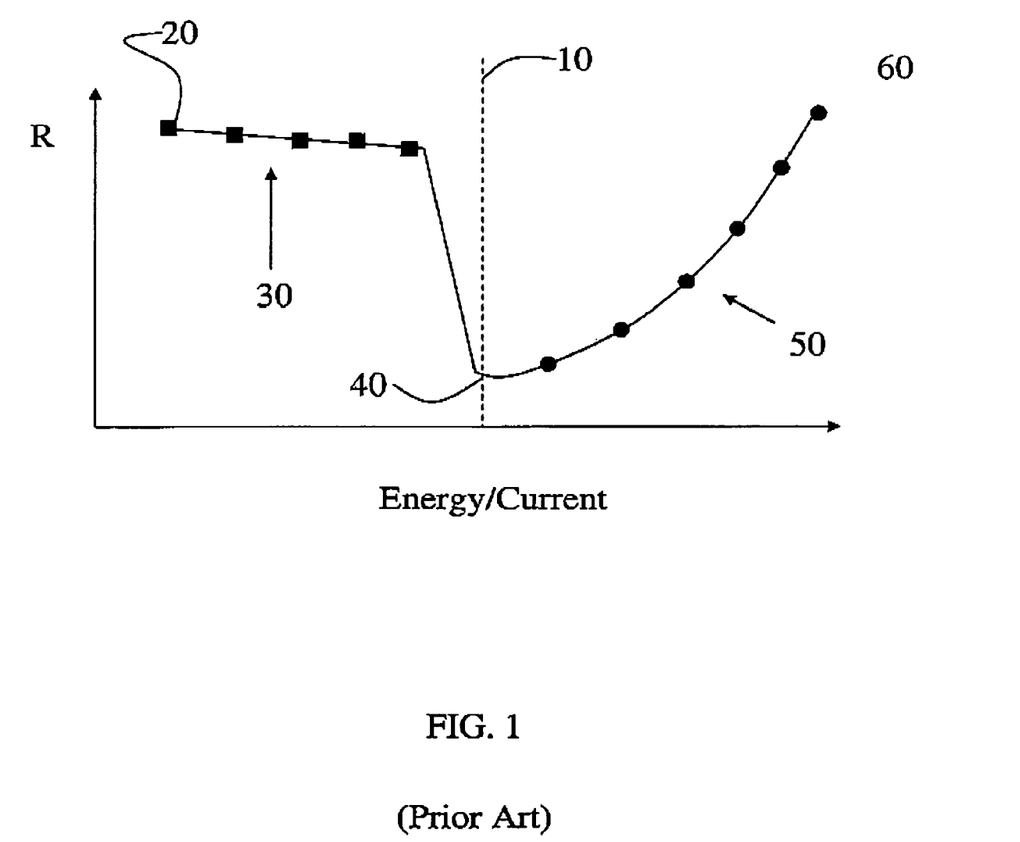
FIG. 1. Representative dependence of the electrical resistance of a chalcogenide material as a function of energy or current.

The use of electrical energy to induce structural transformations relies on the application of electrical (current or voltage) pulses to a chalcogenide material. The mechanism of electrically induced structural transformations may be electronic in nature, possibly with an accompanying or consequent thermal contribution. By controlling the magnitude and/or duration of electrical pulses applied to a chalcogenide material, it is possible to vary continuously vary the fractional crystallinity. The influence of electrical energy on the structure of a chalcogenide material is frequently depicted in terms of the variation of the electrical resistance of a chalcogenide material with the amount of electrical energy provided or the magnitude of the current or voltage pulse applied to a chalcogenide material. A representative depiction of the electrical resistance (R) of a chalcogenide material as a function of electrical energy or current pulse magnitude (Energy/Current) is presented in FIG. 1 herein. FIG. 1 shows the variation of the electrical resistance of a chalcogenide material with electrical energy or current pulse magnitude and may generally be referred to as a resistance plot.

The resistance plot includes two characteristic response regimes of a chalcogenide material to electrical energy. The regimes are approximately demarcated with the vertical dashed line 10 shown in FIG. 1. The regime to the left of the line 10 may be referred to as the accumulating regime of the chalcogenide material. The accumulation regime is distinguished by a nearly constant or weakly varying electrical resistance with increasing electrical energy that culminates in an abrupt decrease in resistance beyond a threshold energy. The accumulation regime thus extends, in the direction of increasing energy, from the leftmost point 20 of the resistance plot, through a plateau region (generally depicted by 30) corresponding to the range of points over which the resistance variation is small or negligible to the set point or state 40 that follows an abrupt decrease in electrical resistance. The left side of the resistance plot is referred to as the accumulating regime because the structural state of the chalcogenide material continuously evolves as energy is applied with the fractional crystallinity of the structural state correlating with the total accumulation of energy. The leftmost point 20 corresponds to the structural state in the accumulating regime having the lowest fractional crystallinity. As energy is added, the fractional crystallinity increases and the chalcogenide material transforms in the direction of increasing energy among a plurality of partially crystalline states along the plateau 30. Selected accumulation states (structural states in the accumulation region) are marked with squares in FIG. 1. Upon accumulation of a threshold amount of energy, the fractional crystallinity of the chalcogenide material increases sufficiently to effect a setting transformation characterized by a dramatic decrease in electrical resistance and stabilization of the set state 40. The structural states in the accumulation regime may be referred to as accumulation states of the chalcogenide material. Structural transformations in the accumulating regime are unidirectional in the sense that they progress in the direction of increasing energy within the plateau region 30 and are reversible only by first driving the chalcogenide material through the set point 40 and resetting as described in, for example U.S. patent application Ser. Nos. 10/155,527 and 10/189,749, the disclosures of which are incorporated by reference herein.

While not wishing to be bound by theory, the instant inventors believe that the addition of energy to a chalcogenide material in the accumulating regime leads to an increase in fractional crystallinity through the nucleation of new crystalline domains, growth of existing crystalline domains or a combination thereof. It is believed that the electrical resistance varies only weakly along the plateau 30 despite the increase in fractional crystallinity because the crystalline domains form or grow in relative isolation of each other so as to prevent the formation of a contiguous crystalline network that spans the chalcogenide material. This type of crystallization may be referred to as sub-percolation crystallization. The setting transformation coincides with a percolation threshold in which a contiguous, interconnected crystalline network forms within the chalcogenide material. Such a network may form, for example, when crystalline domains increase sufficiently in size to impinge or overlap with neighboring domains. Since the crystalline phase of chalcogenide materials is more conductive and less resistive than the amorphous phase, the percolation threshold corresponds to the formation of a contiguous low resistance conductive pathway through the chalcogenide material. As a result, the percolation threshold is marked by a dramatic decrease in the resistance of the chalcogenide material. The leftmost point of the accumulation regime may be an amorphous state or a partially crystalline state lacking a contiguous crystalline network. Sub-percolation crystallization commences with an initial amorphous or partially crystalline state and progresses through a plurality of partially crystalline state having increasingly higher fractional crystallinities until the percolation threshold and setting transformation occur. Further discussion of the behavior of chalcogenide materials in the accumulation regime is provided in U.S. patent application Ser. Nos. 10/144,319; 10/155,527 and 10/189,749 and in U.S. Pat. Nos. 5,912,839 and 6,141,241; the disclosures of which are incorporated by reference herein.

The regime to the right of the line 10 of FIG. 1 may be referred to as the greyscale regime or greyscale region. The greyscale regime extends from the set state 40 through a plurality of intermediate states (generally depicted by 50) to a reset point or state 60. The various points in the greyscale regime may be referred to as greyscale states of the chalcogenide material. Selected greyscale states are marked with circles in FIG. 1. Structural transformations in the greyscale regime may be induced by applying an electric current or voltage pulse to a chalcogenide material. In FIG. 1, an electric current pulse is indicated. In the greyscale regime, the resistance of the chalcogenide material varies with the magnitude of the applied electric pulse. The resistance of a particular state in the greyscale regime is characteristic of the structural state of the chalcogenide material and the structural state of a chalcogenide material is dictated by the magnitude of the current pulse applied in the greyscale region. The fractional crystallinity of the chalcogenide material decreases as the magnitude of the current pulse increases. The fractional crystallinity is highest for greyscale states at or near the set point 40 and progressively decreases as the reset state 60 is approached. The chalcogenide material transforms from a structural state possessing a contiguous crystalline network at the set state 40 to a structural state that is amorphous or substantially amorphous or partially crystalline without a contiguous crystalline network at the reset state 60. The application of current pulses having increasing magnitude has the effect of converting portions of the crystalline network into an amorphous phase and leads to a disruption or interruption of contiguous high conductivity crystalline pathways in the chalcogenide material. As a result, the resistance of the chalcogenide material increases as the magnitude of an applied current pulse increases in the greyscale region.

In contrast to the accumulating region, structural transformations that occur in the greyscale region are reversible and bi-directional. The response of a chalcogenide material to a current pulse is determined by the magnitude of the current pulse relative to the magnitude of the current pulse associated with the initial state of the chalcogenide material at the time the current pulse is applied. As indicated hereinabove, each state in the greyscale region may be identified by its resistance and a current pulse magnitude where application of that current pulse magnitude induces changes in fractional crystallinity that produce the particular resistance value of the state. Application of a subsequent current pulse may increase or decrease the fractional crystallinity relative to the fractional crystallinity of the initial state of the chalcogenide material. If the subsequent current pulse has a higher magnitude than the pulse used to establish the initial state, the fractional crystallinity of the chalcogenide material decreases and the structural state is transformed from the initial state in the direction of the reset state along the greyscale resistance curve. Similarly, if the subsequent current pulse has a lower magnitude than the pulse used to establish the initial state, the fractional crystallinity of the chalcogenide material increases and the structural state is transformed from the initial state in the direction of the set state along the greyscale resistance curve. Further discussion of the properties of chalcogenide materials in the greyscale region may be found, for example, in U.S. Pat. Nos. 5,296,716 and 5,414,271; the disclosures of which are incorporated by reference herein.

As described more fully hereinbelow, data is stored in chalcogenide materials through the structural states of a chalcogenide material. The storage of data occurs through a structural transformation of the chalcogenide material to a structural state corresponding to the information value being stored. The storage of data through appropriate structural transformations may be referred to herein as programming the chalcogenide material. Since information is encoded as structural states of a chalcogenide material in the instant invention, the reading of data requires a detection or determination of the structural state of a chalcogenide material. A method for reading structural states in the accumulation region has been discussed in, for example, U.S. patent application Ser. Nos. 10/144,319; 0.10/155,527 and 10/189,749, and may include a determination of the amount of energy required to transform an accumulation state to the set state. This amount of energy is one way to uniquely characterize or distinguish structural states in the accumulation region. The reading of structural states in the greyscale region is most commonly done through a resistance measurement. The electrical resistance of structural states in the greyscale region provides an effective metric for distinguishing greyscale states.

In the instant invention, a device and method are provided wherein a chalcogenide material is used for data storage where data is stored through the structural states of the chalcogenide material. Distinct structural states of a chalcogenide material are assigned to specific data values and storage of a data value occurs by transforming the chalcogenide material into a structural state characteristic of the data value. The data values may also be viewed as information values since particular data values are oftentimes encoded representations of information. In binary data storage, for example, information is encoded by strings of the binary data values "0" and "1" where "0" and "1" may be viewed as information values in a binary system. The structural states of a chalcogenide material used to store information may be referred to as information states since each distinct structural state corresponds to a particular information or data value. The information states of a chalcogenide material may be selected from the accumulation states, greyscales states or combination thereof. In a binary data storage system, for example, "0" and "1" may be viewed as information values and each information value may be assigned to a distinct structural state of a chalcogenide material. The selected structural states of the chalcogenide material may thus be viewed as the information states associated with the information values "0" and "1".

In addition to binary storage, a chalcogenide material may also be configured to provide non-binary (multary) storage where information or data is stored using three or more information values. In a ternary (e.g. base 3) system, for example, data may be encoded using three information values (e.g. "0", "1" and "2") and each information value may be associated with a distinct structural state of a chalcogenide material so that three information states are selected from among the structural states of the chalcogenide. Structural states in the accumulation region, greyscale region or combination thereof may be selected and associated with particular information values. Storage of a particular information value is accomplished by transforming the chalcogenide material to the information state associated with the information value. As described hereinabove, the transformation may be accomplished by providing energy (e.g. electrical energy, optical energy, particle beam energy, pulsed energy etc.) in an appropriate amount. Storage systems having a higher number of levels (e.g. four level, five level etc. up to an arbitrary number of levels) may be analogously implemented by selecting an appropriate number of information states from among the structural states of the chalcogenide material. Where data is encoded as a string of information values in a storage system having a particular number of levels, the data may be stored by writing each information value in the string to a separate region of chalcogenide material.

In a binary string, the region of memory material used to store an information value is typically referred to as a bit of memory material, or, more simply, a bit. In conventional terms, a bit represents an amount or portion of a binary memory material (normally silicon) allocated for the purpose of storing a "0" or a "1", where the memory material is capable of storing either binary information value (separately, not simultaneously) and where it is possible to switch between the two values through a data programming or processing technique. A bit may analogously be defined for a chalcogenide data storage medium utilizing a binary storage system. In the instant invention, a bit may further be generalized to multary (multiple valued, multilevel or non-binary) data storage systems. In a multary system, a bit corresponds to a portion or region of memory material (chalcogenide, silicon or otherwise) allocated for the storage of an information value and having the capability of being switched among the different information values associated with the storage system. In a four level (e.g. base 4) storage system, for example, the information values "0", "1", "2", and "3" may be used and information states may be selected from among the structural states of a chalcogenide material for each of these information values. In this four level system in the context of the instant invention, a bit corresponds to a portion or region of chalcogenide material allocated for the storage of one of the four information values where switching between information values is possible by providing energy as described hereinabove and in the matter incorporated by reference to induce a structural transformation from an information state associated with one information value to an information state associated with a different information value. A bit may be analogously described for an arbitrary multiple level data storage system. As used herein, a bit thus corresponds to a portion or volume of memory material allocated for the storage of one information value of a storage system having any number of levels.

In conventional data storage devices, each bit of memory material is included in a separate memory cell having two electrical terminals where the two terminals are used to address and program the memory cell to store a particular information value. Two terminal memory cells for storing binary bits in silicon are well known in the art. Two terminal memory cells utilizing a chalcogenide material as the data storage medium have also been discussed. U.S. Pat. Nos. RE37,259; 5,414,271; and 5,296,716, for example, describe single cell chalcogenide memory elements in which a chalcogenide material is placed between two electrical terminals and programmed to particular memory states therewith. The memory states are selected from the greyscale states of the chalcogenide material. U.S. Pat. No. 5,912,839 further describes a single cell memory element having two electrical terminals and a chalcogenide material disposed therebetween where the memory states are selected from among the accumulation states of the chalcogenide material.

U.S. Pat. Nos. RE37,259; 5,414,271; 5,296,716; and 5,912,839 further describe multibit storage in a chalcogenide material where multibit storage refers to an increase in information storage density through the use of a chalcogenide material having multiple storage levels. In U.S. Pat. Nos. RE37,259; 5,414,271; 5,296,716; and 5,912,839, multibit storage is described in terms of binary bits and storage of the equivalent of multiple binary bits of information is accomplished in a memory cell having a single region of chalcogenide material through a multilevel storage system. In these patents, for example, a four level storage scheme provides a storage capacity equivalent to that of two binary bits since two binary bits encompass four different states (00, 01, 10, 11). An eight level storage scheme provides a storage capacity equivalent to that of three binary bits etc.

The instant invention provides a memory cell having three or more electrical terminals and a method of programming such cells for mulitbit storage. In contrast to the memory cells of U.S. Pat. Nos. RE37,259; 5,414,271; 5,296,716; and 5,912,839, the instant invention provides multiple bit storage for both binary and non-binary bits. Multiple bit storage in the context of the instant invention occurs through the selective addressing of specific portions of a region of chalcogenide material contained within the pore of a memory cell. The selective addressing is accomplished through inclusion of additional electrical terminals that are placed in electrical communication with the region of chalcogenide material.

Figure 2:
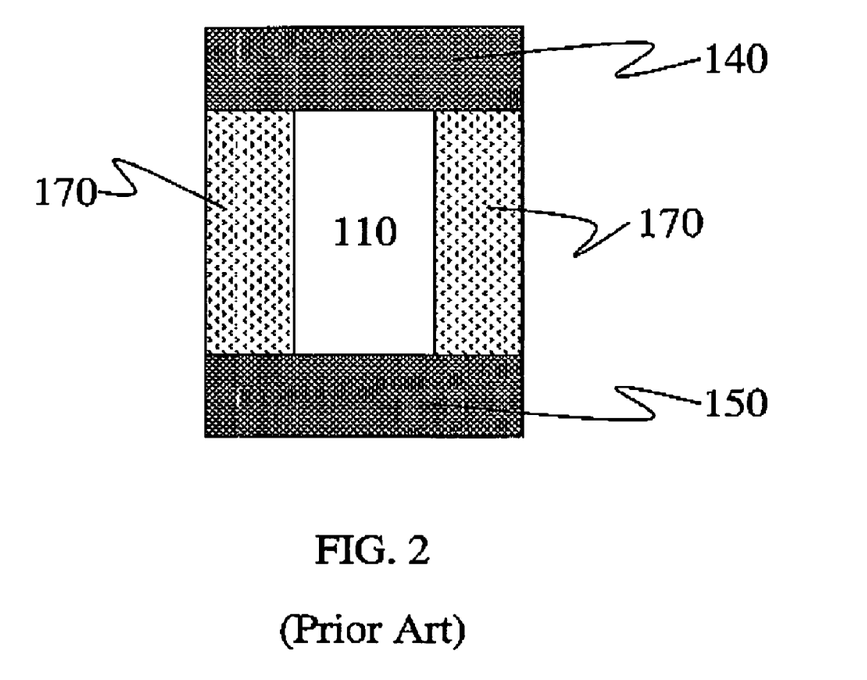
FIG. 2. Schematic depiction of a two-terminal chalcogenide storage device.
Figure 3:
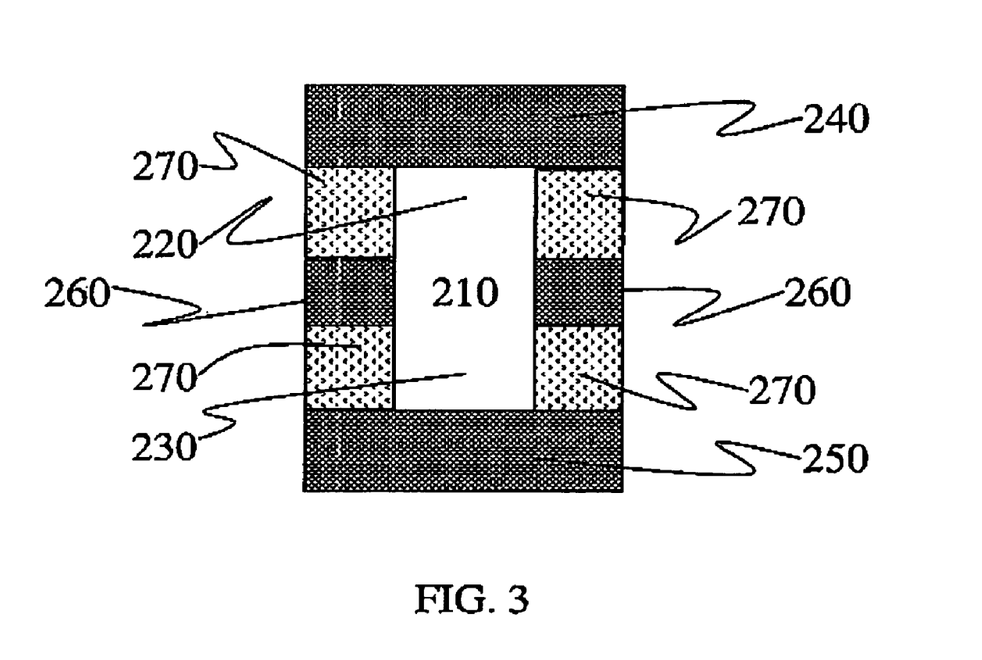
FIG. 3. Schematic depiction of a three-terminal chalcogenide storage device.

A schematic comparison of a two terminal memory cell and one embodiment of a three terminal memory cell according to the instant invention is provided in FIGS. 2 and 3. FIG. 2 shows a typical two terminal chalcogenide memory cell. The cell includes pore region filled with a chalcogenide material 110 that is in electrical contact with a top electrical terminal 140 and a bottom electrical terminal 150. The pore region is preferably cylindrical in shape, but may be non-cylindrical (e.g. rectangular, channel, etc.) as well. Insulating material 170 separates the terminals 140 and 150. Data storage in the two terminal cell is accomplished by providing electrical energy across the terminals 140 and 150. Typically, electrical energy is provided in the form of a current or voltage pulse. Application of electrical energy in an appropriate amount programs or transforms the chalcogenide material to the structural state corresponding to the information value that one wishes to store.

FIG. 3 depicts an embodiment of a three terminal memory cell according to the instant invention. The three terminal memory cell includes a pore filled with a chalcogenide material 210 that is in contact with a top electrical terminal 240, a bottom electrical terminal 250 and an intermediate electrical terminal 260. An insulating or dielectric material or materials 270 separates the electrical terminals 240, 250 and 260. The pore may be cylindrical or non-cylindrical in shape. If the pore is cylindrical, the intermediate terminal 260 is generally annular in shape. If the pore is non-cylindrical, the intermediate terminal 260 is generally circumferential in shape. Storage of data in the three terminal cell occurs by providing an electrical signal to the chalcogenide material through any pair of terminals. Since the device includes three terminals and since structural transformations of the chalcogenide material can be effected by providing electrical energy through two terminals, the three terminal device provides for multiple options for the programming or transformation of the chalcogenide material and permits programming of selected portions or regions of chalcogenide material in the pore of the device. The multiplicity of programming options and ability to program selected portions of the chalcogenide material distinguish the instant multiterminal devices from the two terminal devices of the prior art.

In the embodiment of FIG. 3, the three terminals provide for three programming modes. In a one programming mode, an electrical signal (e.g. current pulse, voltage pulse) is provided between the top terminal 240 and bottom terminal 250 to provide a data storage capability analogous to that of a two terminal chalcogenide memory cell. In this programming mode, the entire volume of chalcogenide material 210 in the pore is subject to the influence of the electrical signal. This programming mode provides for single bit storage in a binary or non-binary system.

In a second programming mode, an electrical signal is provided between the top terminal 240 and the intermediate terminal 260. In this programming mode, the influence of the electrical signal can be limited to only a portion of the chalcogenide material 210. More specifically, application of an electrical signal between terminals 240 and 260 generally influences only that portion of the chalcogenide material located between those terminals while leaving the portion of the chalcogenide material located between intermediate terminal 260 and bottom terminal 250 essentially undisturbed. As a result, a structural transformation may be selectively induced in the upper portion 220 of the chalcogenide material and not the lower portion 230. Selective programming of the upper portion 220 of the chalcogenide material 210 in the pore is thus achievable through the application of an electrical signal between top terminal 240 and intermediate terminal 260.

In a third programming mode, an electrical signal is provided between the bottom terminal 250 and the intermediate terminal 260. In this programming mode, the influence of the electrical signal can also be limited to only a portion of the chalcogenide material 210. More specifically, application of an electrical signal between terminals 250 and 260 generally influences only that portion of the chalcogenide material located between those terminals while leaving the portion of the chalcogenide material located between intermediate terminal 260 and top terminal 240 essentially undisturbed. As a result, a structural transformation may be selectively induced in the lower portion 230 of the chalcogenide material and not the upper portion 220. Selective programming of the lower portion 230 of the chalcogenide material 210 in the pore is thus achievable through the application of an electrical signal between bottom terminal 250 and intermediate terminal 260.

Attainment of selective programming requires the application of electrical signals of suitable magnitude. More specifically, applied signals that provide excess amounts of electrical energy may lead to excursions of energy to portions of the chalcogenide material for which programming was not intended. At excessively high current or voltage magnitudes, a signal applied between two terminals may induce excess heating of the chalcogenide material between those two terminals and this heating may lead to dissipation of thermal energy to portions of the chalcogenide material not located between the terminals to which the signal is applied. Similarly, at sufficiently high current or voltage magnitudes, a signal applied between two terminals may create a conductive filament that saturates the portion of chalcogenide material between the two terminals. Signal levels above saturation may lead to expansion of the filament to portions of the chalcogenide material outside of the portion between the two terminals to which the signal is applied and thus produce an electrical effect that may alter the structural state of the chalcogenide material outside of the region for which selective programming is desired.

Electrical or thermal energy excursion effects may extend the range of influence of an electrical signal applied between two terminals to portions of the chalcogenide material beyond the intended range of influence. If sufficient in magnitude, they may extend even so far as the unutilized electrical terminal and thereby act to defeat or inhibit a selective programming effect. In the context of the instant invention, energy excursion from a programmed portion of chalcogenide material to an unprogrammed portion of chalcogenide material may be a deleterious or beneficial effect depending on the programming objective. In one embodiment of the instant invention, selective programming is desired. In this embodiment, the desired outcome of selective programming is an ability to influence less than all of the chalcogenide material in the pore through use of more than two electrical terminals. By properly controlling the magnitude of the electrical signal applied between two terminals, excursions of thermal or electrical energy to portions of the chalcogenide material not intended to be programmed can be minimized to provide substantially selective programming of the portion of chalcogenide material between the terminals to which the electrical signal is applied.

In another embodiment of the instant invention, the energy content of a programming pulse applied between two terminals is adjusted to provide a controlled amount of excess energy that may be constructively utilized to influence portions of the chalcogenide material adjacent to the portion being directly programmed. In this embodiment, a programming pulse applied between two terminals of a device having three or more terminals influences portions of the chalcogenide material adjacent to the portion located between the two terminals to which the programming pulse is applied. Portions of chalcogenide material, for example in the vicinity of terminals not utilized in the application of a particular programming pulse may be influenced and a structural transformation induced therein. In this embodiment, the excess energy associated with a programming pulse may influence the information state of a bit other than the one being programmed. By controlling the amount of excess energy, it is possible to continuously vary the information state of a non-programmed bit and to control the extent of correlation of the information state of the programmed bit relative to the information state of a non-programmed bit.

As described hereinabove, conventional two terminal chalcogenide memory cells provide single binary bit or single multary bit storage capacity per cell (where single multary bit storage in the context of the instant invention corresponds to the multibit storage described in the foregoing prior art describing two terminal memory cells). This type of storage follows from the fact that the electrical signal used in programming a two terminal cell influences a volume or path of chalcogenide material that fully extends between the two terminals. It is not possible, for example, to selectively program a pathway or volume of chalcogenide material that extends from one terminal of a two terminal device to a selected point in the interior of the pore (i.e. to some point not extending to the other terminal) without influencing the portion of chalcogenide material between the selected point and the other terminal of the device. If, for example, a current pulse having a particular amplitude programs the full length of the pore between the terminals of a two terminal device (e.g. top terminal 140 and bottom terminal 150 of the device shown in FIG. 2), a current pulse having half of that particular amplitude does not simply program half of the length of the pore. Halving of the amplitude may produce a pulse that is incapable of programming at all, a pulse that saturates the pore and programs or influences the chalcogenide material along the full length of the pore, or a pulse that does not saturate the pore and programs or influences the chalcogenide material along the full length of the pore where the particular effect depends on the particular pulse amplitude used to program. A result whereby the pulse influences less than the full length of chalcogenide material does not occur and is a consequence of the fact that application of an electrical signal between the two terminals of a two terminal device necessarily programs or influences a pathway of chalcogenide material extending fully between the two terminals. This requirement follows from the functionality of chalcogenide materials whereby formation of a filament serves as a preliminary effect in the programming or structural transformations of a chalcogenide material. The filament is a conductive region that extends from one electrical terminal to another electrical terminal and through establishment of a filament, a pathway is created in the chalcogenide material that extends over the full length of the pore that is sandwiched by the two terminals of a two terminal memory cell. The presence of the filament creates a region of influence of the electrical signal that extends from one terminal to the other terminal of a two terminal device.

Through the instant selective programming, it is possible to selective program or influence portions of the chalcogenide material that only extend between selected pairs of terminals selected from a group of three or more terminals in electrical communication with the chalcogenide. A filament can be selectively formed between any pair of terminals of a multi-terminal device to provide a selective programming capability. Selective filament formation may permit the formation of a filament that extends from one electrical terminal to another electrical terminal by providing an electrical signal between those two terminals where the filament does not extend to other terminals of the device. Thus, in the example of FIG. 3, it is possible to program or influence portions of chalcogenide material extending over a length less than the length between the top terminal 240 and bottom terminal 250 through use of intermediate terminal 260. As described in one embodiment hereinabove, the three terminal embodiment depicted in FIG. 3 permits the selective formation of a filament and an influencing of chalcogenide material along a pathway extending from intermediate terminal 260 to top terminal 240 without the involvement of bottom terminal 250 and without programming or influencing portions of the chalcogenide material adjacent to bottom terminal 250. Chalcogenide material between intermediate terminal 260 and bottom terminal 250 may be similarly programmed or influenced without influencing chalcogenide material adjacent to top terminal 240. Selective programming of portions of a volume of chalcogenide material may thus be achieved through the formation of a conductive filament that extends between selected pairs of terminals without extending to other terminals of the device in one embodiment of the instant invention.

One embodiment of the instant invention thus provides the ability to independently program selected portions of a volume of chalcogenide material residing in the pore of a memory device. Selective programming permits the inducement of structural transformations of a chalcogenide material in selected portions or regions of the pore, where the selected portions are delineated through the configuration or placement of electrical terminals in electrical communication with the chalcogenide material. Since the selected portions may be independently programmable by providing an electrical signal between the appropriate pair of electrical terminals, the instant invention provides for the independent storage of information values in different spatial regions of a pore of a memory cell. As a result, the instant invention provides for true multiple bit data storage. In the three terminal device of FIG. 3, for example, a first bit of information may be stored in the portion of chalcogenide material influenced by providing an electrical signal between top terminal 240 and intermediate terminal 260 and a second bit of information may be stored in the portion of chalcogenide material influenced by providing an electrical signal between bottom terminal 250 and intermediate terminal 260. The two bits of information are thus stored in different portions of chalcogenide material and may be stored simultaneously within the pore of the memory device. Each of the stored bits may be a binary bit or a multary bit. The two bits may further correspond to information values from the same (e.g. both binary, both ternary etc.) or different (e.g. one binary, one non-binary, one three level bit, one four level bit etc.) base systems.

Figure 4:
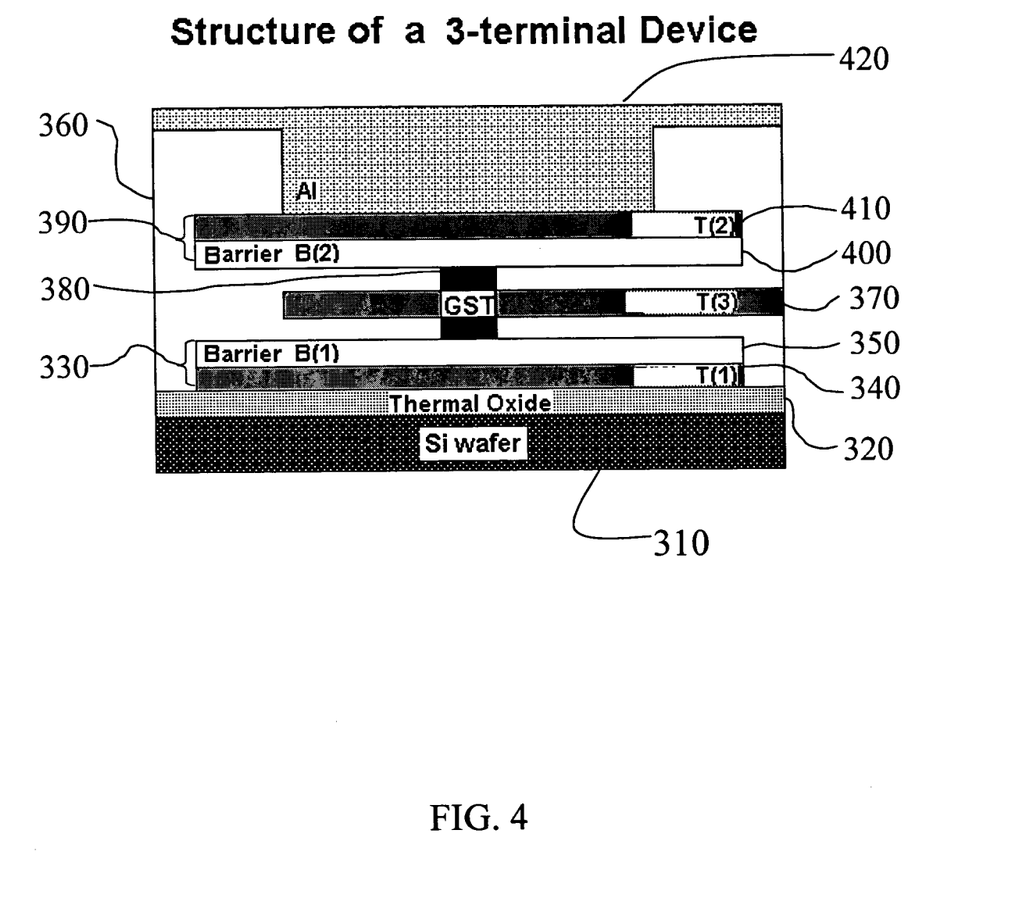
FIG. 4. One embodiment of a three-terminal storage device according to the instant invention.

One example of a device structure according to the instant invention is shown in FIG. 4. FIG. 4 shows a cross-sectional view of a three terminal device structure. The three terminals are labeled T(1), T(2), and T(3). A plurality of these devices was formed on a 641 silicon wafer. The devices and layers on the wafer were formed using conventional sputtering, chemical vapor deposition, etching, and lithography techniques. The structure includes a silicon wafer substrate 310, a thermal oxide layer 320, a bottom terminal 330 that includes a conductive layer 340 formed from TiW or a combination of Ti and TiN and a carbon barrier layer 350, an $SiO_x/SiN_x$ insulating region 360, an intermediate terminal 370 formed from TiW, a pore filled with a chalcogenide material 380, a top terminal 390 that includes a carbon barrier layer 400 and a conductive layer 410 that includes Ti and TiN, and an Al layer 420. In this example, the chalcogenide material 380 is $Ge_2Te_2Sb_5$ and is labeled GST in FIG. 4. The barrier layers inhibit diffusion and electromigration of material into the chalcogenide region and improve the cycle life of the device. Typical layer thicknesses are as follows: conductive layer 340 (100 nm), barrier layer 350 (30 nm), intermediate terminal 370 (10-40 nm), barrier layer 400 (100 nm), and conductive layer 410 (100 nm). The pore region occupied by the chalcogenide material in device of this example is cylindrical with a height of approximately 0.1 micron and a diameter of about 1 micron. The terminals 330, 370 and 390 are in electrical communication with the chalcogenide. The intermediate terminal 370 circumscribes the chalcogenide material 380. The terminals are separated by an insulating material so that electrical communication between terminals occurs through the chalcogenide material.

The device shown in FIG. 4 was tested for selective programming according to the instant invention. In a first experiment, the chalcogenide material of the device was initially transformed to its set state. In the set state, the resistance between each pair of terminals was measured. The resistance between the intermediate terminal 370 and the bottom terminal 330 was measured to be 14 kΩ and the resistance between the top terminal 390 and intermediate terminal 370 was measured to be 6 kΩ. A programming current pulse was subsequently applied between the intermediate terminal 370 and bottom terminal 330. The magnitude and duration of the pulse were 6 mA and 100 ns, respectively. The energy of the applied programming pulse was sufficient to induce a structural transformation in at least a portion of the chalcogenide material between the intermediate terminal 370 and bottom terminal 330. After application of the programming pulse, the resistance between each pair of terminals was measured again. The resistance between the intermediate terminal 370 and the bottom terminal 330 was now measured to be 1.2 MΩ and the resistance between the top terminal 390 and intermediate terminal 370 was now measured to be 8.5 kΩ. This experiment shows that application of the programming pulse between the intermediate terminal 370 and bottom terminal 330 leads to a dramatic increase in the resistance between the intermediate terminal 370 and bottom terminal 330 without significantly affecting the resistance between the intermediate terminal 370 and top terminal 390. A structural transformation of the chalcogenide material has been induced in the lower portion of the pore without influencing the chalcogenide material in the vicinity of the top terminal 390. The high resistance measured between the intermediate terminal 370 and bottom terminal 330 contrasts with the low resistance measured between the intermediate terminal 370 and top terminal 390. The two resistance values correspond to different structural states in the portions of chalcogenide material between the different terminal pairs and may be separately identified with a different information value. This example thus demonstrates the storage of two bits of information in a given volume of chalcogenide material.

After application of the pulse between the bottom terminal 330 and intermediate terminal 370 and measurement of the resistances as described above, a second programming pulse was applied to the device. The second pulse had an amplitude of 75 mA and a duration of 100 ns and was applied between the intermediate terminal 370 and top terminal 390. The magnitude of the programming pulse was sufficient to induce a structural transformation of at least a portion of the chalcogenide material between the intermediate terminal 370 and top terminal 390. After application of the programming pulse, the resistance between each pair of terminals was measured again. The resistance between the intermediate terminal 370 and the bottom terminal 330 after application of the second pulse was measured to be 64 kΩ and the resistance between the top terminal 390 and intermediate terminal 370 was now measured to be 43 kΩ. This experiment shows that application of a programming pulse between the intermediate terminal 370 and top terminal 390 leads to an increase in the resistance of the chalcogenide material between the intermediate terminal 370 and top terminal 390. The higher resistance indicates that the programming pulse has transformed the structural state of the chalcogenide toward a less crystalline state.

In this experiment, in addition, the resistance between the intermediate terminal 370 and bottom terminal 330 was also influenced. More specifically, the resistance between the intermediate terminal 370 and bottom terminal 330 decreased from its value of 1.2 MΩ after application of the first programming pulse described above to a value of 64 kΩ upon application of the second programming pulse. The decrease in the measured resistance indicates that the programming pulse applied between intermediate terminal 370 and top terminal 390 induces a structural transformation in the chalcogenide material between the intermediate terminal 370 and bottom terminal 330 toward a more crystalline state. The occurrence of this structural transformation is an indication that a portion of the energy provided to the portion of chalcogenide material located between the intermediate terminal 370 and top terminal 390 has diffused, been transported to or is otherwise dissipated into the portion of the chalcogenide material located between intermediate terminal 370 and bottom terminal 330. The structural transformation evidences the energy excursion effect described hereinabove wherein energy provided to one portion of a chalcogenide material is transported to and influences the structural state of another portion of the chalcogenide material. The transported energy is energy in excess of that needed to influence the structural state of the chalcogenide material between intermediate terminal 370 and top terminal 390.

The results of this aspect of the experiment demonstrate the potential ability of energy provided to one portion of a chalcogenide material to influence another portion of a chalcogenide material. If such energy excursion is undesired, the experiment indicates that the amplitude and/or duration of the second programming pulse should be decreased to avoid the production of the excess energy that is dissipated away from the portion of chalcogenide material that was intended to be programmed. Alternatively, the excess energy may be viewed as providing an extra degree of freedom in influencing the information content of portions of the chalcogenide material outside of the portion located between the terminals across which the programming pulse was applied. The structural state of the chalcogenide material between intermediate terminal 370 and bottom terminal 330 having a resistance of 64 kΩ may be viewed as an information state independent of and distinct from the set state (resistance in the vicinity of 8 kΩ) and reset state (resistance in the vicinity of 1 MΩ). Through control of the excess energy, it is possible to continuously adjust the resistance of portions of a chalcogenide material outside of the portion directly programmed.

Figure 5:
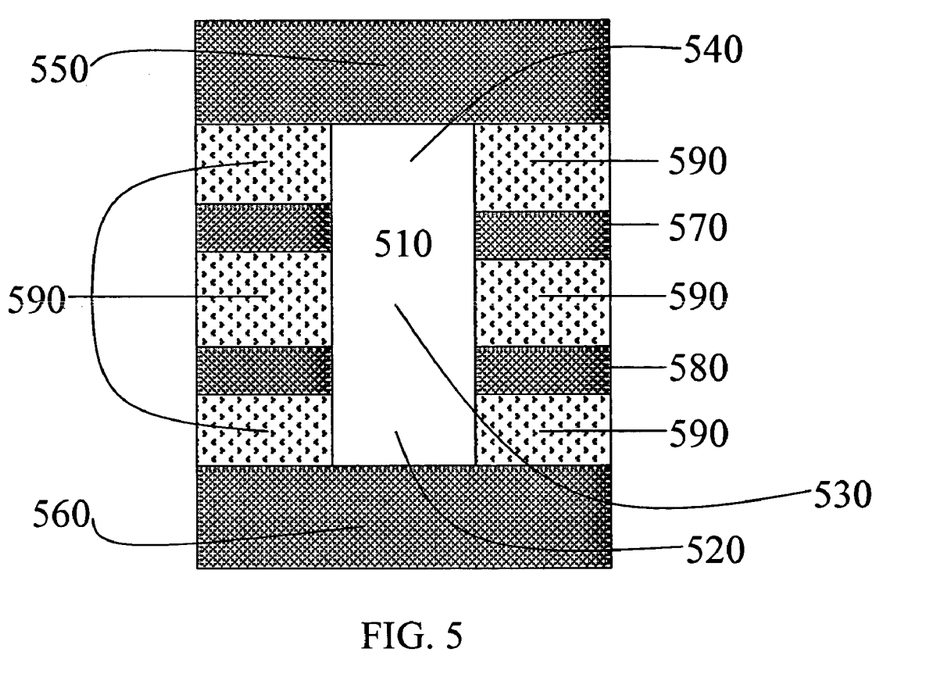
FIG. 5. Schematic depiction of a four-terminal chalcogenide storage device.

The instant invention includes memory cells having three or more electrical terminals in electrical communication with a volume of chalcogenide material. The foregoing example considers an embodiment having three terminals. Corresponding embodiments having four, five or more terminals are also contemplated. FIG. 5, for example, depicts an embodiment having four electrical terminals. The four terminal memory cell includes a pore filled with a chalcogenide material 510 that is in contact with a top electrical terminal 550, a bottom electrical terminal 560, an upper intermediate electrical terminal 570 and a lower intermediate terminal 580. An insulating or dielectric material or materials 590 separates the electrical terminals 550, 560, 570 and 580. Storage of data in the four terminal cell occurs by providing an electrical signal to the chalcogenide material through any pair of terminals. Since the device includes four terminals and since structural transformations of the chalcogenide material can be effected by providing electrical energy through any two terminals, the four terminal device provides for multiple options for the programming or transformation of the chalcogenide material and permits programming of selected portions or regions of chalcogenide material in the pore of the device. The four terminal device provides for up to 3 multary bits of storage through the selective programming of up to 3 distinct portions of the chalcogenide material in the pore depending on the combination of terminals used in programming. One bit of storage is achievable by applying an electrical signal between the bottom terminal 560 and the lower intermediate terminal 580 so that the lower portion 520 of the chalcogenide material in the pore is programmed to store a binary or non-binary information value. A second bit of storage is achievable by applying an electrical signal between the lower intermediate terminal 580 and the upper intermediate terminal 570 so that the middle portion 530 of the chalcogenide material in the pore is programmed to store a binary or non-binary information value. A third bit of storage is achievable by applying an electrical signal between the upper intermediate terminal 570 and top terminal 550 so that the upper portion 540 of the chalcogenide material in the pore is programmed to store a binary or non-binary information value.

If desired, the four terminal device may also be used to store one or two bits of information through selective programming that involves less than all of the device terminals. Single bit programming, for example, can be achieved by applying an electrical signal between the top terminal 550 and the bottom terminal 560 so that programming occurs across the whole length of the chalcogenide material in the pore. Two bit programming may similarly be achieved through selective programming that utilizes any three of the four terminals. As one example of two bit programming of a four terminal cell, one may selectively program using top terminal 550, upper intermediate terminal 570 and bottom terminal 560. Other combinations of three terminals may similarly be used to achieve two bit programming. Generalization to embodiments having more than four terminals is readily apparent.

Figure 6:
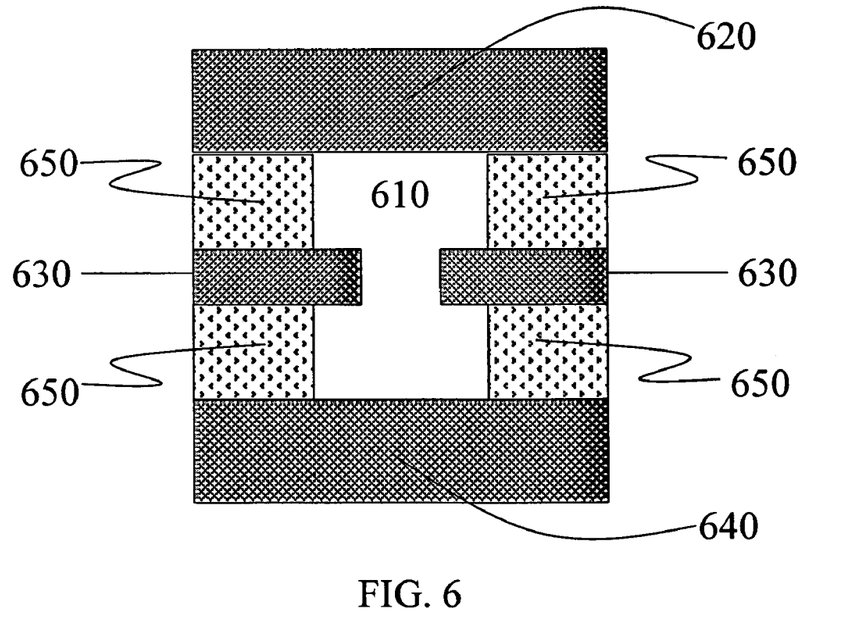
FIG. 6. Schematic depiction of a three-terminal storage device having a non-uniformly cylindrical pore region.

The foregoing examples have considered primarily embodiments having a generally cylindrical pore with annular intermediate terminals. Other embodiments of the instant invention include devices having non-cylindrical pores such as rectangular pores, spherical pores, channel pores, pores having a non-uniform cross-section etc. and electrical terminals having shapes, including circumferential or non-annular, suitable for providing electrical energy to non-cylindrical pores. The chalcogenide material is a continuous volume that occupies or fills the pore. An example of a three terminal device with a volume of chalcogenide material in a pore having a non-uniform cross section is shown in FIG. 6. This three terminal memory cell includes a pore filled with a chalcogenide material 610 that is in contact with a top electrical terminal 620, a bottom electrical terminal 640, and an intermediate electrical terminal 630. An insulating or dielectric material or materials 650 separates the electrical terminals 620, 630, and 640. In this embodiment, the intermediate terminal creates a narrowing of the pore diameter in the central portion of the pore to provide non-uniformity in the diameter of the pore.

Also within the scope of the instant invention are embodiments in which the pore of the device includes two or more compositions of chalcogenide material. In a three terminal device, for example, the memory cell includes a top terminal, a bottom terminal and an intermediate terminal which may be used to define separately programmable upper and lower portions of chalcogenide material in the pore. A further embodiment of the instant invention provides for different chalcogenide compositions in the upper and lower selectively programmable portions of the pore. Analogous embodiments are further provided for devices having four or more terminals.

The electrical terminals of the instant devices are in electrical communication with the chalcogenide material. The electrical terminals include a conductive material and are capable of providing electrical signals such as electrical current pulses or voltage pulses to the chalcogenide material. The electrical terminals may directly or indirectly provide or induce current flow or a voltage gradient within a chalcogenide material. Terminals that operate by injection or through a field effect are within the scope of the instant invention. Representative injection terminals include those described in co-pending parent application U.S. patent application Ser. No. 10/384,994 and representative field effect terminals include those described in co-pending parent application U.S. patent application Ser. No. 10/426,321.

Methods of programming according to the instant invention are directed at the programming of chalcogenide memory cells having three or more terminals in electrical communication with a chalcogenide material. The three or more terminals delineate separately programmable portions of the volume of chalcogenide material occupying the pore and the methods of programming are directed at the storage of two or more binary or non-binary bits or information values through the selective programming of spatially distinguishable portions of chalcogenide material as described hereinabove. The methods of programming include the steps of selecting a pair of electrical terminals, providing an electrical signal (e.g. current pulse or voltage pulse) across the selected terminals so that a portion of chalcogenide material between the selected terminals is transformed to a structural state corresponding to an information value that one wishes to store where the information value may be a binary or non-binary information value. Further programming can occur by selecting another pair of electrical terminals, applying an electrical signal across those terminals so that another portion of chalcogenide material is programmed to store an information value. In this way, multiple multary bit storage is achieved in a continuous volume of chalcogenide material within the pore of a memory cell. Various methods of programming to achieve multiple multary bit storage are within the scope of the invention that include combinations of the steps of selecting a pair of electrical terminals, programming across the selected pair of terminals by applying an electrical signal where the programming induces a structural transformation of a chalcogenide material to an information state corresponding to the information value being stored, and repeating for other pairs of terminals.

The disclosure and discussion set forth herein is illustrative and not intended to limit the practice of the instant invention. While there have been described what are believed to be the preferred embodiments of the instant invention, those skilled in the art will recognize that other and further changes and modifications may be made thereto without departing from the spirit of the invention, and it is intended to claim all such changes and modifications that fall within the full scope of the invention. It is the following claims, including all equivalents, in combination with the foregoing disclosure, which define the scope of the instant invention.

I claim:

1. A chalcogenide device comprising:
   a chalcogenide material having a plurality of structural states, said structural states including accumulation states and greyscale states;
   a first terminal in electrical communication with said chalcogenide material;
   a second terminal in electrical communication with said chalcogenide material, said second terminal having a circumferential shape, said second terminal surrounding and in contact with said chalcogenide material;
   a third terminal in electrical communication with said chalcogenide material;
   wherein said chalcogenide material includes a first portion in a first structural state and a second portion in a second structural state, said first and second structural states being selected from among said accumulation states or said greyscale states, and wherein said second terminal is formed vertically between said first and third terminals.

2. The device of claim 1, wherein said chalcogenide material comprises S, Se, or Te.

3. The device of claim 2, wherein said chalcogenide material further comprises Ge or Sb.

4. The device of claim 2, wherein said chalcogenide material further comprises As or Si.

5. The device of claim 2, wherein said chalcogenide material further comprises an element selected from the group consisting of Al, In, Bi, Pb, Sn, P. and O.

6. The device of claim 2, wherein said chalcogenide further comprises a transition metal.

7. The device of claim 1, wherein the composition of said first portion of said chalcogenide material differs from the composition of said second portion of said chalcogenide material.

8. The device of claim 1, wherein the resistance of said first structural state differs from the resistance of said second structural state.

9. The device of claim 1, wherein said first and second structural states are selected from among said greyscale states.

10. The device of claim 1, wherein said device stores two or more bits of information.

11. The device of claim 10, wherein said bits are non-binary bits.

12. The device of claim 1, wherein said chalcogenide material has a shape having a non-uniform cross section.

13. The device of claim 1, further comprising one or more additional terminals in electrical communication with said chalcogenide material.

14. The device of claim 13, wherein said chalcogenide material further includes a third portion in a third structural state said third structural state being selected from among said accumulation states or said greyscale states.

15. The device of claim 1, wherein said second terminal has an annular shape.

* * * * *